US012757508B2

(12) United States Patent
Liu et al.

(10) Patent No.: US 12,757,508 B2
(45) Date of Patent: Oct. 6, 2026

(54) SENSING DEVICE, AND METHOD OF MANUFACTURING THE SAME

(71) Applicant: InnoLux Corporation, Miao-Li County (TW)

(72) Inventors: Yu-Tsung Liu, Miao-Li County (TW); Hui-Ching Yang, Miao-Li County (TW); Cheng-Hsueh Hsieh, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 449 days.

(21) Appl. No.: 18/347,338

(22) Filed: Jul. 5, 2023

(65) Prior Publication Data

US 2024/0055454 A1 Feb. 15, 2024

(30) Foreign Application Priority Data

Aug. 15, 2022 (CN) ......................... 202210975607.6

(51) Int. Cl.
*H10F 39/10* (2025.01)
*H10F 39/00* (2025.01)

(52) U.S. Cl.
CPC ....... *H10F 39/8057* (2025.01); *H10F 39/024* (2025.01); *H10F 39/8037* (2025.01)

(58) Field of Classification Search
CPC ............... H10F 39/8057; H10F 39/024; H10F 39/8037; H10F 39/103; H10F 77/334; H10F 71/00
See application file for complete search history.

(56) References Cited

U.S. PATENT DOCUMENTS

| | | | | |
|---|---|---|---|---|
| 2001/0052566 A1 | 12/2001 | Hwang et al. | | |
| 2009/0026509 A1* | 1/2009 | Hayashi | H10F 39/802 257/292 | |
| 2020/0200925 A1* | 6/2020 | Jeon | H10F 39/195 | |
| 2020/0258935 A1* | 8/2020 | Huang | H10F 77/703 | |
| 2021/0126036 A1* | 4/2021 | Arahata | H04N 25/77 | |
| 2021/0216743 A1* | 7/2021 | Liu | G06V 40/1318 | |
| 2023/0349806 A1* | 11/2023 | Kanda | G01N 15/075 | |

FOREIGN PATENT DOCUMENTS

| | | | | |
|---|---|---|---|---|
| CN | 107623011 A | 1/2018 | | |
| CN | 112687715 A | 4/2021 | | |
| WO | WO-2018180577 A1 * | 10/2018 | H05B 33/12 | |

* cited by examiner

*Primary Examiner* — Samuel Park
(74) *Attorney, Agent, or Firm* — McClure, Qualey & Rodack, LLP

(57) ABSTRACT

A sensing device is provided. The sensing device includes a substrate, a circuit layer, a photosensitive element, a light-shielding layer, and a conductive layer. The circuit layer is disposed on the substrate. The photosensitive element is disposed on the substrate and is electrically connected to the circuit layer. The light-shielding layer is disposed on the photosensitive element and has an opening. The opening overlaps the photosensitive element. The conductive layer is disposed on the light-shielding layer. In addition, the conductive layer passes through the opening and is electrically connected to the photosensitive element. A method of manufacturing a sensing device is also provided.

16 Claims, 9 Drawing Sheets

SENSING DEVICE, AND METHOD OF MANUFACTURING THE SAME

CROSS REFERENCE TO RELATED APPLICATIONS

This application claims the benefit of China Application No. 202210975607.6, filed Aug. 15, 2022, the entirety of which is incorporated by reference herein.

BACKGROUND

Technical Field

The present disclosure is related to a sensing device and a method of manufacturing the sensing device, and in particular it is related to a method of manufacturing a sensing device that can simplify the manufacturing process.

Description of the Related Art

Optical sensing devices are widely used in consumer electronic products such as smartphones and wearable devices, and have become an indispensable necessity in modern society. With the rapid development of these consumer electronics, consumers have high expectations regarding their quality, functionality, or price.

The photosensitive element in the optical sensing device can convert received light into an electrical signal, and the electrical signal that is generated can be transmitted to the driving element and logic circuit in the optical sensing device for processing and analysis.

In order to improve the performance of the sensing device, developing a method of manufacturing the sensing device that can further simplify the manufacturing process or reduce costs (for example, by reducing the number of photomasks used and steps required) is still one of the current research topics in the industry.

SUMMARY

In accordance with some embodiments of the present disclosure, a sensing device is provided. The sensing device includes a substrate, a circuit layer, a photosensitive element, a light-shielding layer, and a conductive layer. The circuit layer is disposed on the substrate. The photosensitive element is disposed on the substrate and is electrically connected to the circuit layer. The light-shielding layer is disposed on the photosensitive element and has an opening. The opening overlaps the photosensitive element. The conductive layer is disposed on the light-shielding layer. In addition, the conductive layer passes through the opening and is electrically connected to the photosensitive element.

In accordance with some embodiments of the present disclosure, a method of manufacturing a sensing device is provided. The method includes providing a substrate and forming a circuit layer on the substrate. The method includes forming a photosensitive element on the circuit layer and forming a first insulating layer on the photosensitive element. The method includes forming a light-shielding layer on the first insulating layer and forming an opening in the light-shielding layer. The opening overlaps the photosensitive element. The method includes patterning the first insulating layer through the opening to expose the photosensitive element. The method includes forming a conductive layer on the light-shielding layer. The conductive layer passes through the opening and is electrically connected to the photosensitive element.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
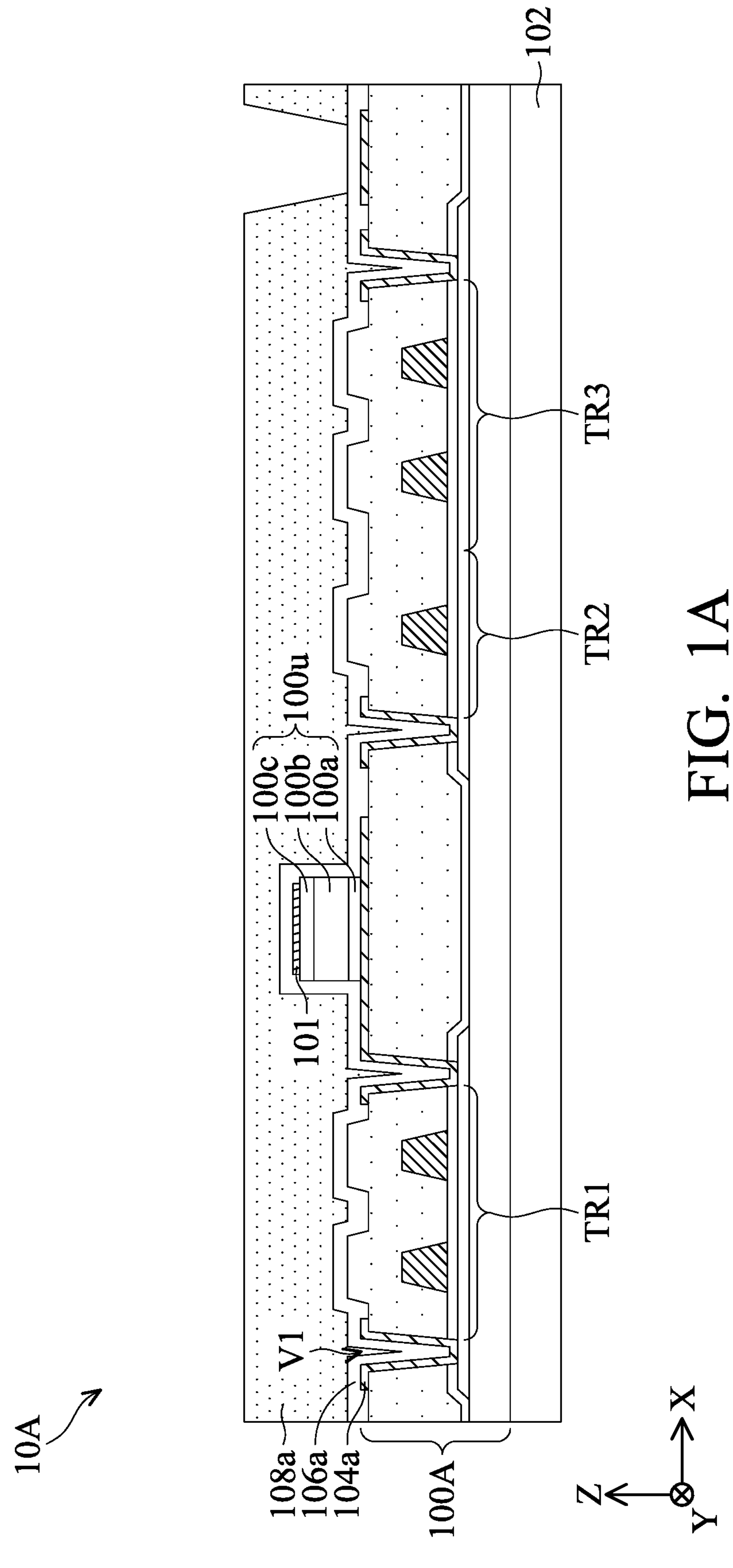
FIG. 1A to FIG. 1C are cross-sectional diagrams of a sensing device in different manufacturing stages in accordance with some embodiments of the present disclosure.

The sensing device and the method of manufacturing the sensing device according to the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, “lower”, “bottom”, “higher” or “top” are used to describe the position of one element relative to another. It should be appreciated that if a device is flipped upside down, an element that is “lower” will become an element that is “higher”. The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression “a first material layer is disposed on or over a second material layer” may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean+/−10% of the stated value, or typically +/−5% of the stated value, or typically +/−3% of the stated value, or typically +/−2% of the stated value, or typically +/−1% of the stated value or typically +/−0.5% of the stated value. The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

Sensing devices usually integrate thin-film transistors, photosensitive elements (such as photodiodes) and optical elements (such as elements with collimator functions) therein. A large number of photomasks need to be used in the manufacturing process, and the manufacturing process is relatively complicated.

In accordance with the embodiments of the present disclosure, a method of manufacturing a sensing device is provided, which can integrate parts of the structures of the elements in the sensing device. For example, partial structures of the photosensitive element and the optical element are integrated, or partial structures of the photosensitive element and the circuit layer are integrated. In this way, the number of masks and steps used in the process can be reduced, thereby simplifying the manufacturing process or improving the yield. In accordance with the embodiments of the present disclosure, the sensing device manufactured by the aforementioned manufacturing method can reduce the equivalent capacitance of the photosensitive element, thereby improving the sensitivity of the sensing device, or improving the overall performance of the sensing device. In addition, in accordance with some embodiments, the structural design of the photosensitive element can further reduce the occurrence of leakage current or reduce the capacitance value, thereby improving the performance of the photosensitive element.

Figure 1B:
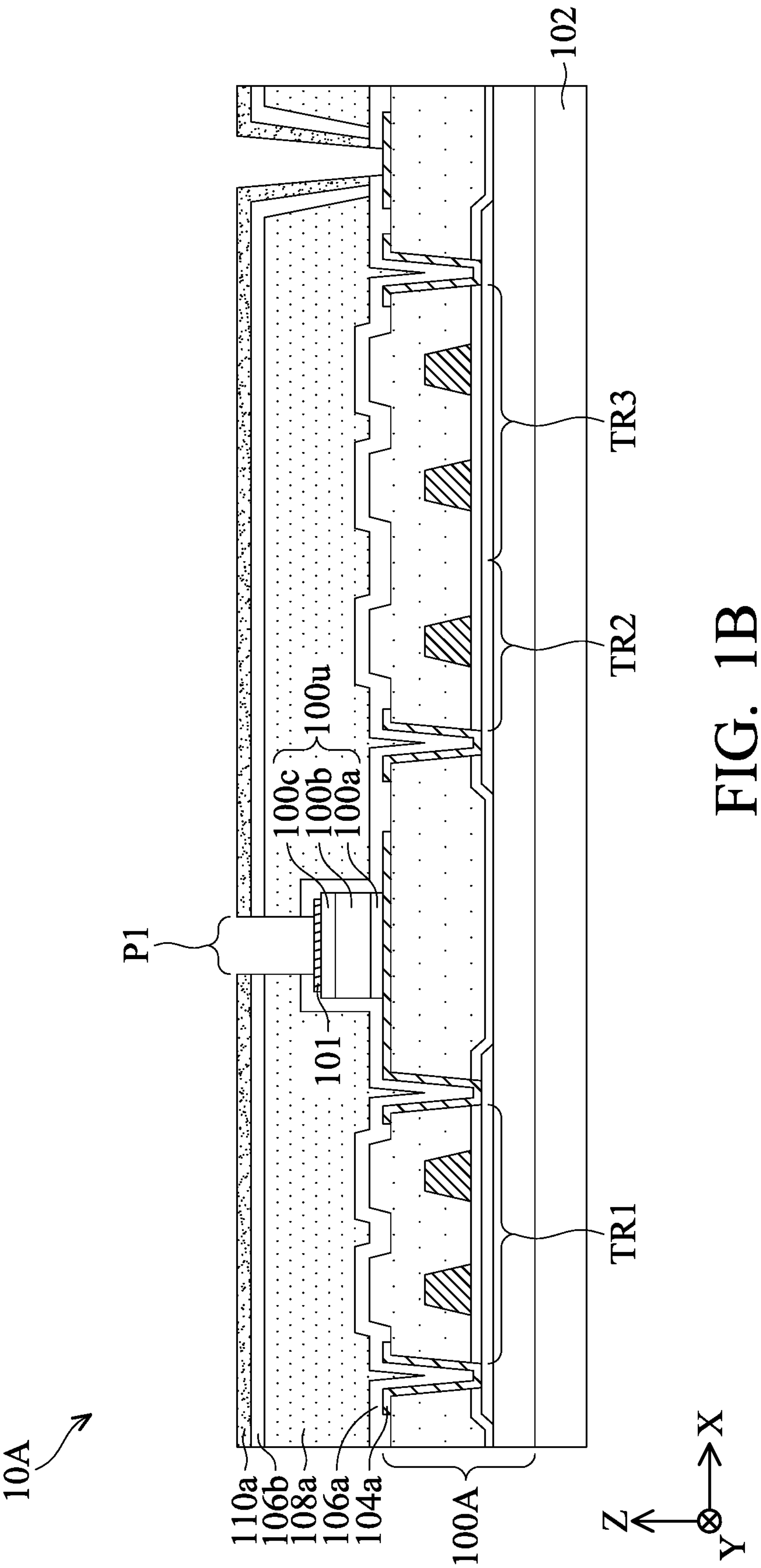
Figure 1C:
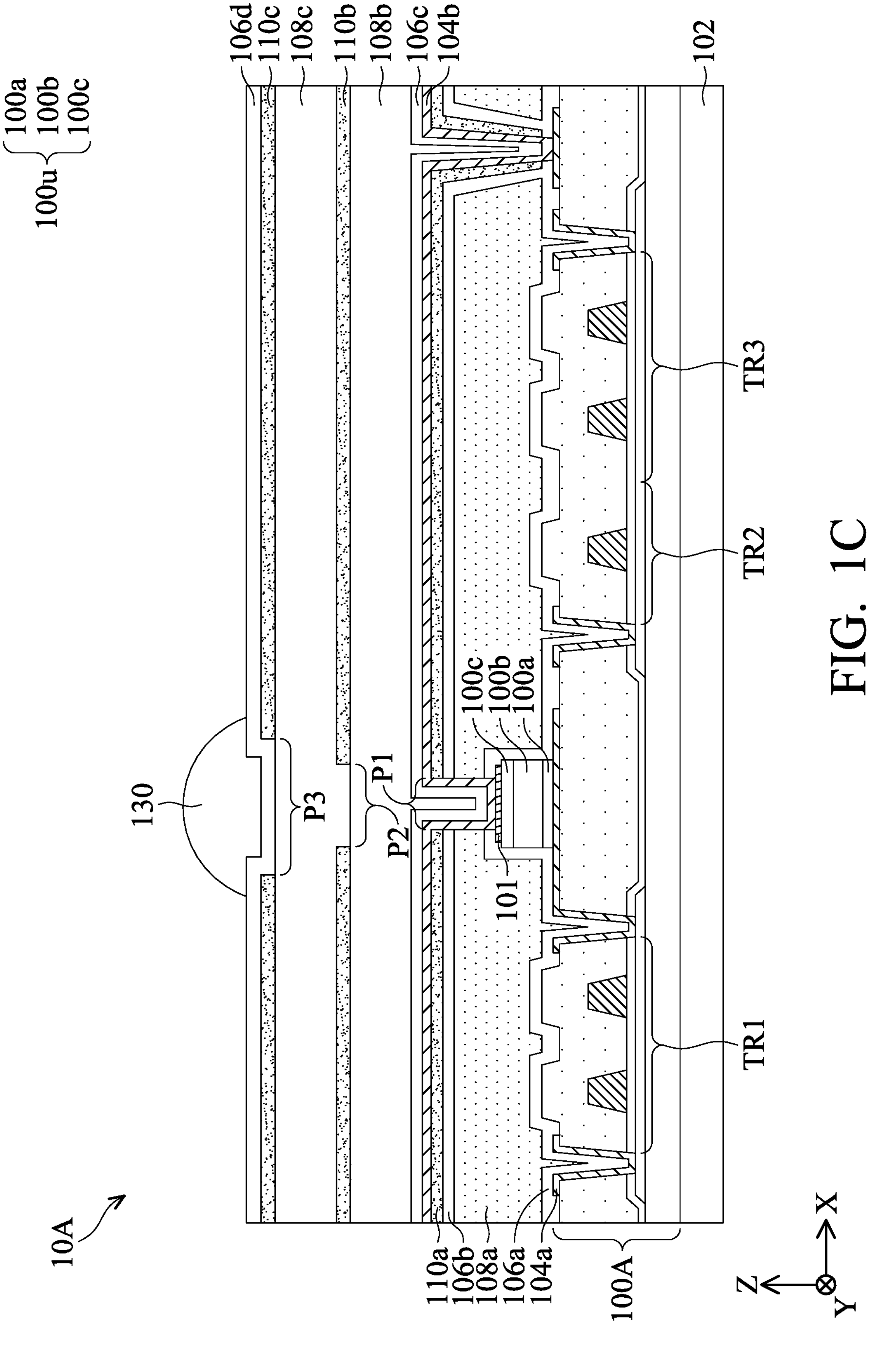

Please refer to FIG. 1A to FIG. 1C. FIG. 1A to FIG. 1C are cross-sectional diagrams of a sensing device 10A in different manufacturing stages in accordance with some embodiments of the present disclosure. It should be understood that, in accordance with some embodiments, additional operation steps may be provided before, during and/or after the method of manufacturing the sensing device 10A. In accordance with some embodiments, some of the operation steps may be replaced or omitted. In accordance with some embodiments, the order of some of the operation steps may be interchangeable. In addition, it should be understood that, for clarity, some components of the sensing device 10A are omitted in the drawing, and only some components are schematically shown. In accordance with some embodiments, additional features may be added to the sensing device 10A described below. In accordance with some other embodiments, some features of the sensing device 10A described below may be replaced or omitted.

First, referring to FIG. 1A, a substrate 102 is provided. Next, the circuit layer 100A is formed on the substrate 102. In accordance with some embodiments, the circuit layer 100A includes a buffer layer (not illustrated) and thin-film transistors, such as a thin-film transistor TR1, a thin-film transistor TR2 and a thin-film transistor TR3 shown in the drawing. The circuit layer 100A may include conductive elements and signal lines electrically connected to the thin-film transistors, insulating layers formed between the conductive elements, and planarization layers etc. In accordance with some embodiments, the signal lines may include, for example, current signal lines, voltage signal lines, high-frequency signal lines, and low-frequency signal lines, and the signal lines may transmit device operating voltage (VDD), common ground voltage (VSS), or the voltage of driving device terminal, but the present disclosure is not limited thereto.

In accordance with some embodiments, the thin-film transistor may include a switching transistor, a driving transistor, a reset transistor, a transistor amplifier or another suitable thin-film transistor. Specifically, in accordance with some embodiments, the thin-film transistor TR1 is a reset transistor, the thin-film transistor TR2 is a transistor amplifier or a source follower, and the thin-film transistor TR3 is a switching transistor, but the present disclosure is not limited thereto.

It should be understood that the number of thin-film transistors is not limited to that is shown in the drawing, and according to different embodiments, the sensing device 10A may have other suitable numbers or types of thin-film transistors. Furthermore, the type of thin-film transistor may include a top gate TFT, a bottom gate TFT, a dual gate or double gate TFT, or a combination thereof. In accordance with some embodiments, the thin-film transistor is further electrically connected to a capacitive element, but it is not limited thereto. Furthermore, the thin-film transistor may include at least one semiconductor layer, a gate dielectric layer, and a gate electrode layer. In accordance with some embodiments, the material of the semiconductor layer may include amorphous silicon, polysilicon or metal oxide, and different thin-film transistors may include different semiconductor materials. For example, the semiconductor material of the thin-film transistor TR1 or the thin-film transistor TR3 is metal oxide, and the semiconductor material of the thin-film transistor TR2 is polysilicon, but the present disclosure is not limited thereto. In accordance with some embodiments, the semiconductor materials of the thin-film transistor TR1, the thin-film transistor TR2 and the thin-film transistor TR3 are all polysilicon. Thin-film transistors can exist in various forms known to those skilled in the art, and the detailed structure of thin-film transistors will not be repeated herein.

In accordance with some embodiments, the substrate 102 includes a flexible substrate, a rigid substrate, or a combination thereof, but it is not limited thereto. In accordance with some embodiments, the material of the substrate 102 may include glass, quartz, sapphire, ceramic, polyimide (PI), polycarbonate (PC), polyethylene terephthalate (PET), polypropylene (PP), another suitable material, or a combination thereof, but it is not limited thereto. Moreover, in accordance with some embodiments, the substrate 102 includes a metal-glass fiber composite board or a metal-ceramic composite board, but it is not limited thereto. In addition, the transmittance of the substrate 102 is not limited. That is, the substrate 102 can be a transparent substrate, a semi-transparent substrate or an opaque substrate.

As shown in FIG. 1A, in accordance with some embodiments, the circuit layer 100A includes a conductive layer 104*a*, and the conductive layer 104*a* can be used as a source electrode or a drain electrode of a thin-film transistor. The source electrode or the drain electrode can be further electrically connected to the subsequently formed photosensitive element. Specifically, in accordance with some embodiments, portions of the gate dielectric layer and the dielectric layer in the circuit layer 100A are removed by a patterning process to form a via hole V1, and then the conductive layer 104*a* is formed in the via hole V1.

In accordance with some embodiments, the conductive layer 104*a* includes a conductive material, such as a metal material, a transparent conductive material, another suitable conductive material, or a combination thereof, but it is not limited thereto. The metal material may include, for example, copper (Cu), silver (Ag), gold (Au), tin (Sn), aluminum (Al), molybdenum (Mo), tungsten (W), chromium (Cr), nickel (Ni), platinum (Pt), titanium (Ti), alloys of the aforementioned metals, another suitable metal material, or a combination thereof, but it is not limited thereto. The transparent conductive material includes transparent conductive oxide (TCO), for example, may include indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material, or a combination thereof, but it is not limited thereto.

In accordance with some embodiments, the conductive layer 104*a* may be formed by a chemical vapor deposition process, a physical vapor deposition process, an electroplating process, an electroless plating process, another suitable process, or a combination thereof. The chemical vapor deposition process may include, for example, a low pressure chemical vapor deposition (LPCVD), a low-temperature chemical vapor deposition (LTCVD), a rapid thermal chemical vapor deposition (RTCVD), a plasma enhanced chemical vapor deposition (PECVD) or an atomic layer deposition (ALD), etc., but it is not limited thereto. The physical vapor deposition process may include, for example, a sputtering process, an evaporation process, a pulsed laser deposition, etc., but it is not limited thereto. Furthermore, portions of the gate dielectric layer and the dielectric layer may be removed by one or more photolithography processes and/or etching processes to form the via hole V1. In accordance with some embodiments, the photolithography process may include photoresist coating (e.g., spin coating), soft baking, hard baking, mask aligning, exposure, post-exposure baking, developing the photoresist, rinsing, drying, etc., but it is not limited thereto. The etching process includes a dry etching process or a wet etching process, but it is not limited thereto.

Next, a photosensitive element 100*u* is formed on the circuit layer 100A. In accordance with some embodiments, in the normal direction of the substrate 102 (e.g., the Z direction in the drawing), the photosensitive element 100*u* overlaps the source electrode or the drain electrode (for example, the conductive layer 104*a*) of the thin-film transistor (for example, the thin-film transistor TR1). The photosensitive element 100*u* can be electrically connected to the thin-film transistor of the circuit layer 100A through the conductive layer 104*a*. The photosensitive element 100*u* can receive light, convert it into an electrical signal, and transmit the generated electrical signal to the circuit layer 100A, and the electrical signal can be processed and analyzed by the circuit elements (for example, the thin-film transistor TR1, thin-film transistor TR2, and thin-film transistor TR3) in the circuit layer 100A. In accordance with some embodiments, the photosensitive element 100*u* includes a photodiode, another element capable of converting optical signals and electrical signals, or a combination thereof, but it is not limited thereto.

Specifically, the photosensitive element 100*u* includes a first-type semiconductor layer 100*a*, a second-type semiconductor layer 100*c*, and an intrinsic semiconductor layer 100*b*. The first-type semiconductor layer 100*a* is formed on the circuit layer 100A first. The intrinsic semiconductor layer 100*b* is formed on the first-type semiconductor layer, and then the second-type semiconductor layer 100*c* is formed on the intrinsic semiconductor layer 100*b*. In accordance with some embodiments, the first-type semiconductor layer 100*a* of the photosensitive element 100*u* is directly formed on the conductive layer 104*a*, and the first-type semiconductor layer 100*a* is electrically connected to the conductive layer 104*a*. For example, the photosensitive element 100*u* may be in contact with the source electrode or the drain electrode of the thin-film transistor (e.g., the thin-film transistor TR1), but the present disclosure is not limited thereto. In accordance with some embodiments, there are several photosensitive elements 100*u* electrically connected to the conductive layer 104*a*, but the present disclosure is not limited thereto. It should be noted that, with the aforementioned structural configuration, the photosensitive element 100*u* can be in contact with the thin-film transistor of the circuit layer 100A for direct electrical connection. The photosensitive element 100*u* and the thin-film transistor do not need to be electrically connected through additional conductive layers and insulating layers, so that the manufacturing process can be simplified and the manufacturing cost can be reduced.

The photosensitive element 100*u* can have a P-I-N structure, an N-I-P structure or another suitable structure. When light irradiates the photosensitive element 100*u*, electron-hole pairs may be generated to form a photocurrent. In accordance with some embodiments, the first-type semiconductor layer 100*a* is, for example, an N-type doped semiconductor layer, and the second-type semiconductor layer 100*c* is, for example, a P-type doped semiconductor layer, which are combined with the intrinsic semiconductor layer 100*b* to form an N-I-P structure from bottom to top, but the present disclosure is not limited thereto. In accordance with some other embodiments, the first-type semiconductor layer 100*a* is, for example, a P-type doped semiconductor layer, and the second-type semiconductor layer 100*c* is, for example, an N-type doped semiconductor layer, which are combined with the intrinsic semiconductor layer 100*b* to form a P-I-N structure from bottom to top, but the present disclosure is not limited thereto.

In accordance with some embodiments, the materials of the first-type semiconductor layer 100*a*, the intrinsic semiconductor layer 100*b*, and the second-type semiconductor layer 100*c* includes semiconductor materials, such as silicon (e.g., amorphous silicon), germanium, indium gallium arsenide (InGaAs), or another suitable material. In accordance with some embodiments, the first-type semiconductor layer 100*a*, the intrinsic semiconductor layer 100*b*, and the second-type semiconductor layer 100*c* may be formed by an epitaxial growth process, an ion implantation process, a chemical vapor deposition process, a physical vapor deposition process, another suitable process, or a combination thereof.

In addition, a transparent conductive layer 101 is formed on the second-type semiconductor layer 100*c* of the photosensitive element 100*u*. In accordance with some embodiments, the transparent conductive layer 101 can serve as an electrode of the photosensitive element 100*u*. In accordance with some embodiments, the edge of the transparent conductive layer 101 is indented compared to the edge of the photosensitive element 100*u* (e.g., the edge of the second-type semiconductor layer 100*c*), but the present disclosure is not limited thereto. The detailed structure of the photosensitive element 100*u* will be further described below.

In accordance with some embodiments, the material of the transparent conductive layer 101 includes a transparent conductive material. The transparent conductive material includes a transparent conductive oxide (TCO), for example, may include indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material, or a combination thereof, but it is not limited thereto.

In accordance with some embodiments, the transparent conductive layer 101 may be formed by a chemical vapor deposition process, a physical vapor deposition process, an electroplating process, an electroless plating process, another suitable process, or a combination thereof. Furthermore, the transparent conductive layer 101 may be patterned by one or more photolithography processes and/or etching processes.

Next, an insulating layer 106*a* and/or an insulating layer 108*a* are formed on the photosensitive element 100*u*. Specifically, the insulating layer 106*a* is conformally formed on the circuit layer 100A, the photosensitive element 100*u* and the transparent conductive layer 101, and the insulating layer 106*a* covers the conductive layer 104*a*. The insulating layer 108*a* is formed on the circuit layer 100A, the photosensitive element 100*u* and the transparent conductive layer 101, and the insulating layer 108*a* covers the conductive layer 104*a*, or is further formed on the insulating layer 106*a*. The insulating layer 108*a* can serve as a planarization layer.

The insulating layer 106*a* may have a single-layer or multi-layer structure. In accordance with some embodiments, the material of the insulating layer 106*a* includes an inorganic material, an organic material, or a combination thereof, but it is not limited thereto. For example, the inorganic material may include silicon nitride, silicon oxide, silicon oxynitride, another suitable material, or a combination thereof, but it is not limited thereto. For example, the organic material may include polyethylene terephthalate (PET), polyethylene (PE), polyethersulfone (PES), polycarbonate (PC), polymethylmethacrylate (PMMA), polyimide (PI), another suitable material, or a combination thereof, but it is not limited thereto.

In accordance with some embodiments, the insulating layer 106*a* may be formed by a coating process, a chemical vapor deposition process, a physical vapor deposition process, a printing process, an evaporation process, a sputtering process, another suitable process, or a combination thereof. In accordance with some embodiments, the insulating layer 106*a* may be patterned by one or more photolithography processes and/or etching processes as required, but the present disclosure is not limited thereto.

In accordance with some embodiments, the material of the insulating layer 108*a* includes an organic material, an inorganic material, another suitable material, or a combination thereof, but it is not limited thereto. For example, the inorganic material may include silicon nitride, silicon oxide, silicon oxynitride, aluminum oxide, another suitable material, or a combination thereof, but it is not limited thereto. For example, the organic material may include epoxy resins, silicone resins, acrylic resins (such as polymethylmetacrylate, PMMA), polyimide, perfluoroalkoxy alkane (PFA), another suitable material, or a combination thereof, but it is not limited thereto.

In accordance with some embodiments, the insulating layer 108*a* may be formed by a chemical vapor deposition process, a physical vapor deposition process, a coating process, a printing process, another suitable process, or a combination thereof. In addition, a planarization process may be performed on the insulating layer 108*a* to have a substantially flat top surface. In accordance with some embodiments, the planarization process may include a grinding process, a chemical-mechanical polish (CMP) process, another suitable planarization process, or a combination thereof. In some embodiments, the insulating layer 108*a* may be patterned by one or more photolithography processes and/or etching processes as required, but the present disclosure is not limited thereto.

Please refer to FIG. 1B. Next, an insulating layer 106*b* and a light-shielding layer 110*a* are formed on the insulating layer 108*a*. In accordance with some embodiments, the insulating layer 106*b* is formed on the insulating layer 108*a* first, and then the light-shielding layer 110*a* is formed on the insulating layer 106*b*. In addition, an opening P1 is formed in the light-shielding layer 110*a*. The opening P1 overlaps the photosensitive element 100*u* in the normal direction of the substrate 102 (e.g., the Z direction in the drawing). Then, the insulating layer 106*a*, the insulating layer 108*a* and the insulating layer 106*b* are patterned through the opening P1 to expose the photosensitive element 100*u*. Specifically, a portion of the light-shielding layer 110*a* is removed to form the opening P1, and then the light-shielding layer 110*a* is used as a mask to perform a patterning process on the insulating layer 106*a*, the insulating layer 108*a*, and the insulating layer 106*b*. The insulating layer 106*a*, the insulating layer 108*a*, and the insulating layer 106*b* disposed below the opening P1 are removed to form a hole exposing a portion of the photosensitive element 100*u* (for example, the transparent conductive layer 101 serving as an electrode of the photosensitive element 100*u*).

It should be noted that the light-shielding layer 110*a* can be used as a mask for the patterning process, which can reduce the number of photomasks used in the manufacturing process and reduce the manufacturing cost. Moreover, the light-shielding layer 110*a* also has optical functions. For example, the light-shielding layer 110*a* also can reduce the reflection of light and absorb the light reflected back and forth between the metal conductive layers to achieve the effect of anti-reflection or reduce optical noise. Furthermore, the opening P1 has the function of collimating light and can be used as a pinhole. With the aforementioned structural configuration, the photosensitive element 100*u* can be integrated with parts of the structures of the optical element, thereby simplifying the manufacturing process or improving the yield.

In accordance with some embodiments, the material of the insulating layer 106*b* is the same as or similar to that of the aforementioned insulating layer 106*a*, and the method of forming the insulating layer 106*b* is the same or similar to that of forming the aforementioned insulating layer 106*a*, and thus will not be repeated here.

In accordance with some embodiments, the light-shielding layer 110*a* includes a metal material, such as copper (Cu), aluminum (Al), molybdenum (Mo), indium (In), ruthenium (Ru), tin (Sn), Gold (Au), platinum (Pt), zinc (Zn), silver (Ag), titanium (Ti), lead (Pb), nickel (Ni), chromium (Cr), magnesium (Mg), palladium (Pd), alloys of the aforementioned materials, another suitable metal material, or a combination thereof, but it is not limited thereto. In these embodiments, the impedance of the transparent conductive material in contact with it can be effectively reduced or the miniaturization of the opening can be improved to achieve a good light collimation effect. In accordance with some other embodiments, the light-shielding layer 110*a* includes an organic material, such as black resin, another suitable organic light-shielding material, or a combination thereof, but it is not limited thereto.

In accordance with some embodiments, the light-shielding layer 110*a* may be formed by a chemical vapor deposition process, a physical vapor deposition process, an electroplating process, an electroless plating process, another suitable process, or a combination thereof. Furthermore, the light-shielding layer 110*a* may be patterned by one or more photolithography processes and/or etching processes to form the opening P1.

Please refer to FIG. 1C. Next, a conductive layer 104*b* is formed on the light-shielding layer 110*a*, and the conductive layer 104*b* passes through the opening P1 and is electrically connected to the photosensitive element 100*u*. Specifically, the conductive layer 104*b* is conformally formed on the light-shielding layer 110*a*, and extends into the hole exposing the photosensitive element 100*u*. In addition, the conductive layer 104*b* may be further formed on the side surfaces of the insulating layer 106*a*, the insulating layer 108*a*, the insulating layer 106*b* and the light-shielding layer 110*a*, but the present disclosure is not limited thereto. The conductive layer 104*b* may be in contact with the transparent conductive layer 101, such that the transparent conductive layer 101 may be disposed between the photosensitive element 100*u* and the conductive layer 104*b*, but it is not limited thereto. In this embodiment, the conductive layer 104*b* is electrically connected to the transparent conductive layer 101. That is, the conductive layer 104*b* is electrically connected to the electrode of the photosensitive element 100*u*. In accordance with some embodiments, the conductive layer 104*b* can be used to provide a common voltage to the photosensitive element 100*u*, but it is not limited thereto.

In accordance with some embodiments, the conductive layer 104*b* includes a transparent conductive material. The transparent conductive material includes a transparent conductive oxide (TCO), for example, may include indium tin oxide (ITO), antimony oxide zinc (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material, or a combination thereof, but it is not limited thereto.

In accordance with some embodiments, the conductive layer 104*b* may be formed by a chemical vapor deposition process, a physical vapor deposition process, an electroplating process, an electroless plating process, another suitable process, or a combination thereof. In some embodiments, the conductive layer 104*b* may be patterned by one or more photolithography processes and/or etching processes as required, but the present disclosure is not limited thereto.

Next, an insulating layer 106*c* is formed on the conductive layer 104*b*. The insulating layer 106*c* is conformally formed on the conductive layer 104*b*, and extends into the aforementioned hole exposing the photosensitive element 100*u*.

In accordance with some embodiments, the material of the insulating layer 106*c* can be the same or similar to that of the aforementioned insulating layer 106*a* or insulating layer 106*b*, and the method of forming the insulating layer 106*c* can be the same as or similar to that of the aforementioned insulating layer 106*a* or insulating layer 106*b*, and thus will not be repeated here.

Next, an insulating layer 108*b* is formed on the insulating layer 106*c*, and a portion of the insulating layer 108*b* can also extend into the aforementioned hole exposing the photosensitive element 100*u*. After that, a light-shielding layer 110*b*, an insulating layer 108*c*, a light-shielding layer 110*c* and a micro-lens 130 are sequentially formed above the insulating layer 108*b*. In this embodiment, an insulating layer 106*d* can be further included, and the insulating layer 106*d* is disposed above the insulating layer 108*c* and the light-shielding layer 110*c*, and the micro-lens 130 is formed on the insulating layer 106*d*. The insulating layer 108*b* and the insulating layer 108*c* can be used as a planarization layer. In accordance with some embodiments, in the normal direction of the substrate 102 (e.g., the Z direction in the drawing), the microlens 130 partially overlaps the light-shielding layer 110*c*.

The light-shielding layer 110*b* and the light-shielding layer 110*c* can reduce the reflection of light. For example, the light-shielding layer 110*b* and the light-shielding layer 110*c* can absorb the light reflected back and forth between the metal conductive layers to achieve the effect of anti-reflection or reducing optical noise. The light-shielding layer 110*b* and the light-shielding layer 110*c* can also block the incident light with a large angle to achieve the effect of reducing the signal-to-noise ratio. As shown in FIG. 1C, the light-shielding layer 110*b* is disposed on the light-shielding layer 110*a*, the light-shielding layer 110*b* has an opening P2, and the opening P2 overlaps the opening P1. Specifically, the opening P2 of the light-shielding layer 110*b* overlaps the opening P1 of the light-shielding layer 110*a* in the normal direction of the substrate 102 (e.g., the Z direction in the drawing). In accordance with some embodiments, the light-shielding layer 110*b* may have a plurality of openings P2, and the plurality of openings P2 overlap the plurality of openings P1 respectively. Furthermore, the light-shielding layer 110*c* is disposed on the light-shielding layer 110*b*, the light-shielding layer 110*c* has an opening P3, and the opening P3 overlaps the opening P2. Specifically, the opening P3 of the light-shielding layer 110*c* overlaps the opening P2 of the light-shielding layer 110*b* in the normal direction of the substrate 102. In accordance with some embodiments, the light-shielding layer 110*c* may have a plurality of openings P3, and the plurality of openings P3 overlap the plurality of openings P2 respectively.

In addition, the width of the opening P2 is, for example, greater than or equal to the width of the opening P1, and the width of the third opening P3 is, for example, greater than or equal to the width of the second opening P2. In accordance with some embodiments, the width of the opening P1 is between 1 micrometer (μm) and 5 micrometers (μm) (i.e. 1 μm≤width of the opening P1≤5 μm), but it is not limited thereto. In accordance with some embodiments, the width of the opening P2 is between 5 micrometers (μm) and 10 micrometers (μm) (i.e. 5 μm≤width of the opening P2≤10 μm), but it is not limited thereto. In accordance with some embodiments, the width of the opening P3 is between 10 micrometers (μm) and 20 micrometers (μm) (i.e. 10 μm≤width of the opening P3≤20 μm), but it is not limited thereto.

In accordance with the embodiments of the present disclosure, the widths of the opening P1, the opening P2, and the opening P3 respectively refer to the maximum widths of the bottommost part of the opening P1, the opening P2, and the opening P3 in a direction perpendicular to the normal direction of the substrate 102 (for example, the X direction in the drawing). It should be understood that, in accordance with the embodiments of the present disclosure, an optical microscope (OM), a scanning electron microscope (SEM), a film thickness profiler (α-step), an ellipsometer or another suitable method may be used to measure the width, thickness or height of each element, or the distance or spacing between elements. Specifically, in accordance with some embodiments, a scanning electron microscope may be used to obtain a cross-sectional image including the elements to be measured, and the width, thickness or height of each element, or the distance or spacing between elements in the image can be measured.

In addition, the microlens 130 can help to focus the light at a specific area. For example, it can focus the light on the photosensitive element 100*u*. As shown in FIG. 1C, the microlens 130 is disposed on the photosensitive element 100*u* and overlaps the opening P1, the opening P2, and the opening P3 in the normal direction of the substrate 102 (e.g., the Z direction in the figure). In accordance with some embodiments, using the microlens 130 together with the opening P1, the opening P2 and the opening P3 which have the function of collimating light facilitates the miniaturization of the photosensitive element 100*u* and reduces the influence of stray capacitance on the photocurrent of the photosensitive element 100*u*.

In accordance with some embodiments, the material of the insulating layer 108*b* and the insulating layer 108*c* is the same as or similar to that of the aforementioned insulating layer 108*a*, and the method of forming the insulating layer 108*b* and the insulating layer 108*c* is the same as or similar to that of forming the aforementioned insulating layer 108*a*, and thus will not be repeated here.

In accordance with some embodiments, the material of the light-shielding layer 110*b* and the light-shielding layer 110*c* is the same as or similar to that of the aforementioned light-shielding layer 110*a*, and the method of forming the light-shielding layer 110*b* and the light-shielding layer 110*c* is the same as or similar to that of forming the aforementioned light-shielding layer 110*a*, and thus will not be repeated here. Furthermore, the light-shielding layer 110*b* and the light-shielding layer 110*c* may be patterned by one or more photolithography processes and/or etching processes, so as to form the opening P2 and the opening P3 respectively.

In accordance with some embodiments, the material of the microlens 130 may include silicon oxide, polymethylmethacrylate (PMMA), cycloolefin polymer (COP), polycarbonate (PC), another suitable material, or a combination thereof, but it is not limited thereto.

In accordance with some embodiments, the microlens 130 may be formed by a chemical vapor deposition process, a physical vapor deposition process, a coating process, printing process, another suitable process, or a combination thereof. Moreover, the microlens 130 can be patterned to have a suitable shape and profile by a photolithography process and/or an etching process.

As shown in FIG. 1C, the formed sensing device 10A includes a substrate 102, a circuit layer 100A, a photosensitive element 100*u*, a light-shielding layer 110*a*, and a conductive layer 104*b*. The circuit layer 100A is disposed on the substrate 102. The photosensitive element 100*u* is disposed on the substrate 102 and electrically connected to the circuit layer 100A. The light-shielding layer 110*a* is disposed on the photosensitive element 100*u* and has an opening P1. The opening P1 overlaps the photosensitive element 100*u*. The conductive layer 104*b* is disposed on the light-shielding layer 110*a*, and the conductive layer 104*b* passes through the opening P1 and is electrically connected to the photosensitive element 100*u*. In accordance with some embodiments, the light-shielding layer 110*a* includes a metal material, and the light-shielding layer 110*a* is electrically connected to the conductive layer 104*b*. In accordance with some embodiments, the light-shielding layer 110*a* includes an organic material, and the light-shielding layer 110*a* is in contact with the conductive layer 104*b*. In accordance with some embodiments, the circuit layer 100A includes a thin-film transistor (e.g., the thin-film transistor TR1), and the photosensitive element 100*u* overlaps a source electrode or a drain electrode (e.g., the conductive layer 104*a*) of the thin-film transistor TR1. In accordance with some embodiments, the photosensitive element 100*u* is in contact with a source electrode or a drain electrode (e.g., the conductive layer 104*a*) of a thin-film transistor (e.g., the thin-film transistor TR1). In accordance with some embodiments, the sensing device 10A further includes a transparent conductive layer 101, and the transparent conductive layer 101 is disposed between the photosensitive element 100*u* and the conductive layer 104*b*.

Figure 2:
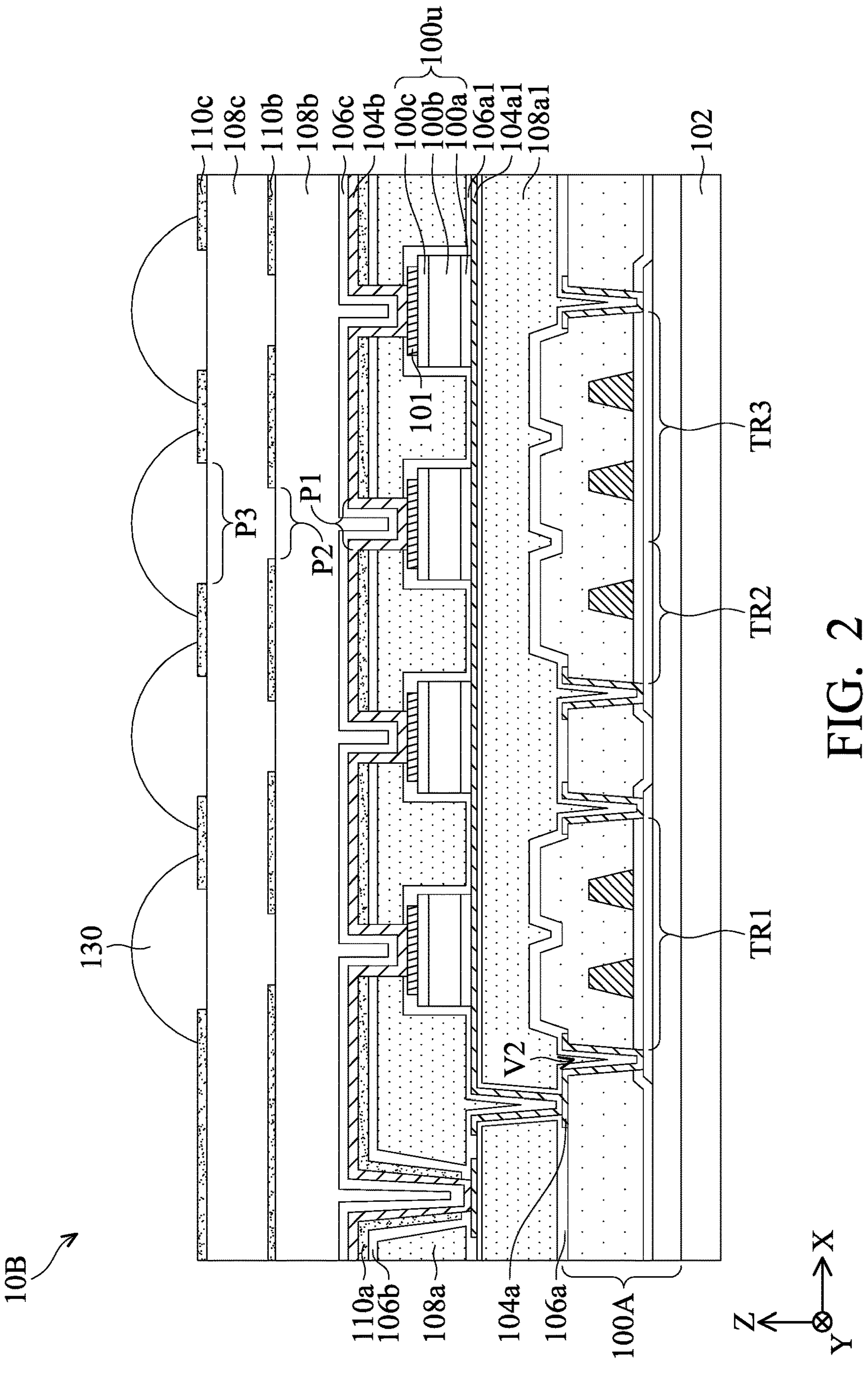
FIG. 2 is a cross-sectional diagram of a sensing device in accordance with some embodiments of the present disclosure.

Next, please refer to FIG. 2, which is a cross-sectional diagram of a sensing device 10B in accordance with some other embodiments of the present disclosure. It should be understood that, for clarity, some elements of the sensing device 10B are omitted in the drawing, and only some elements are schematically shown. In accordance with some embodiments, additional features may be added to the sensing device 10B described below. In accordance with some other embodiments, some features of the sensing device 10B described below may be replaced or omitted. In addition, it should be understood that the same or similar components or elements in the following description will be represented by the same or similar reference numerals, and their materials, manufacturing methods and functions are the same or similar to those described above, and thus will not be repeated herein.

The sensing device 10B shown in FIG. 2 is substantially similar to the sensing device 10A. The difference between them includes that the sensing device 10B further includes a conductive layer 104*a*1, an insulating layer 106*a*1 and an insulating layer 108*a*1 disposed between the circuit layer 100A and the photosensitive element 100*u*. The photosensitive element 100*u* can be electrically connected to the thin-film transistor of the circuit layer 100A through the additional conductive layer 104*a*1. Specifically, in this embodiment, after forming the conductive layer 104*a* and the insulating layer 106*a*, the insulating layer 108*a*1 is formed on the conductive layer 104*a* and the insulating layer 106*a*. The insulating layer 108*a*1 covers the aforementioned conductive layer 104*a* and the insulating layer 106*a*, and the insulating layer 108*a*1 covers the thin-film transistor TR1, the thin-film transistor TR2 and the thin-film transistor TR3. Then, a portion of the insulating layer 108*a*1 is removed by a patterning process to form the via hole V2, and then the insulating layer 106*a*1 and the conductive layer 104*a*1 are formed on the insulating layer 108*a*1 and in the via hole V2. As shown in FIG. 2, a portion of the conductive layer 104*a*1 passes through the insulating layer 108*a*1 and is electrically connected to the conductive layer 104*a*, and the conductive layer 104*a*, for example, passes through the gate dielectric layer and the dielectric layer and is electrically connected to the semiconductor layer of the thin-film transistor TR1. Next, the photosensitive element 100*u* is formed on the conductive layer 104*a*1, and the photosensitive element 100*u* is electrically connected to the thin-film transistor of the circuit layer 100A through the conductive layer 104*a*1 and the conductive layer 104*a*.

In addition, the sensing device 10B includes a plurality of photosensitive elements 100*u* electrically connected to the conductive layer 104*a*1, and the conductive layer 104*a*1 can serve as an electrode of the photosensitive element 100*u*. Moreover, the conductive layer 104*b* is electrically connected to the plurality of transparent conductive layers 101 disposed on the photosensitive elements 100*u*. The photosensitive device 10B also has a plurality of openings P1, a plurality of openings P2 and a plurality of openings P3 corresponding to the plurality of photosensitive elements 100*u*. Furthermore, as shown in FIG. 2, in accordance with some embodiments, the microlens 130 can be directly disposed on the insulating layer 108*c* and the light-shielding layer 110*c*, and the insulating layer 106*d* can be selectively omitted. In addition, in the normal direction of the substrate 102 (e.g., in the Z direction in the drawing), the microlens 130 partially overlaps the light-shielding layer 110*c*. In accordance with some embodiments, the number of the photosensitive element 100*u* may be one, but it is not limited thereto.

In accordance with some embodiments, the materials of the conductive layer 104*a*1 and the insulating layer 106*a*1 are the same as or similar to that of the aforementioned conductive layer 104*a* and the insulating layer 106*a*, and the methods of forming the conductive layer 104*a*1 and the insulating layer 106*a*1 are the same as or similar to that of forming the aforementioned conductive layer 104*a* and insulating layer 106*a*, and thus will not be repeated here.

Figure 3A:
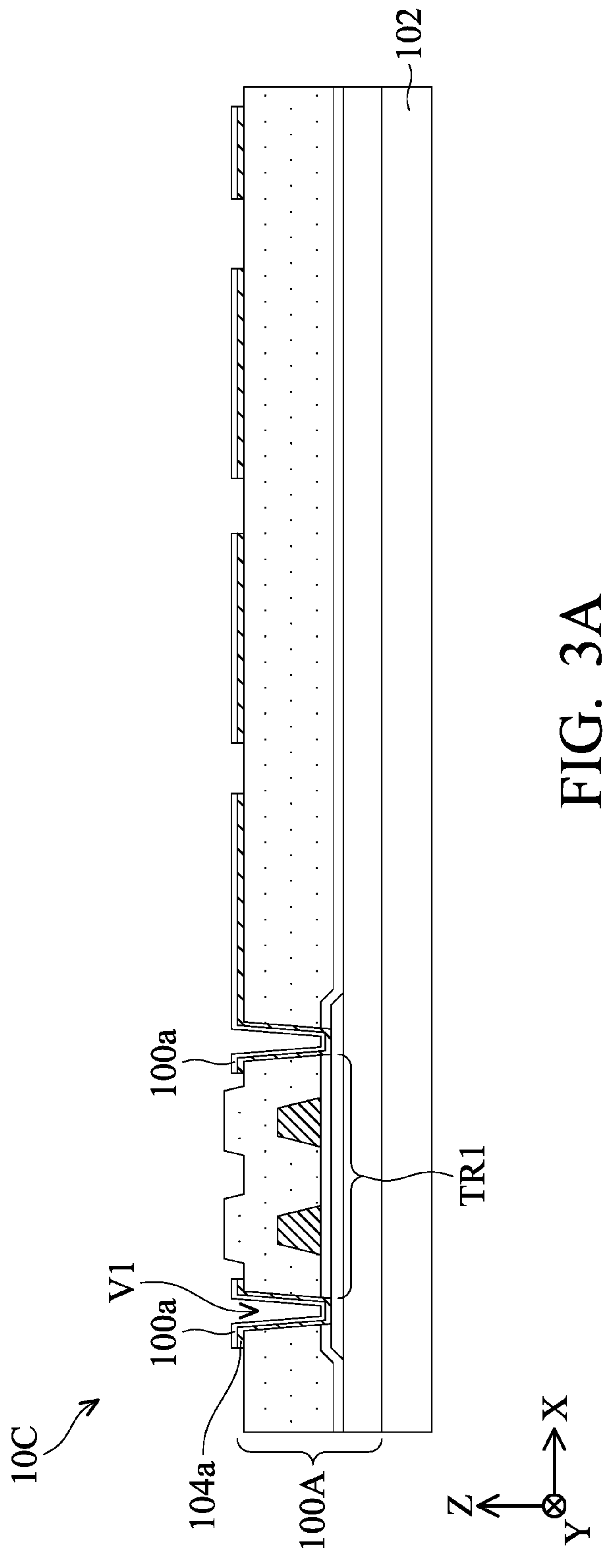
FIG. 3A to FIG. 3C are cross-sectional diagrams of a sensing device in different manufacturing stages in accordance with some embodiments of the present disclosure.
Figure 3B:
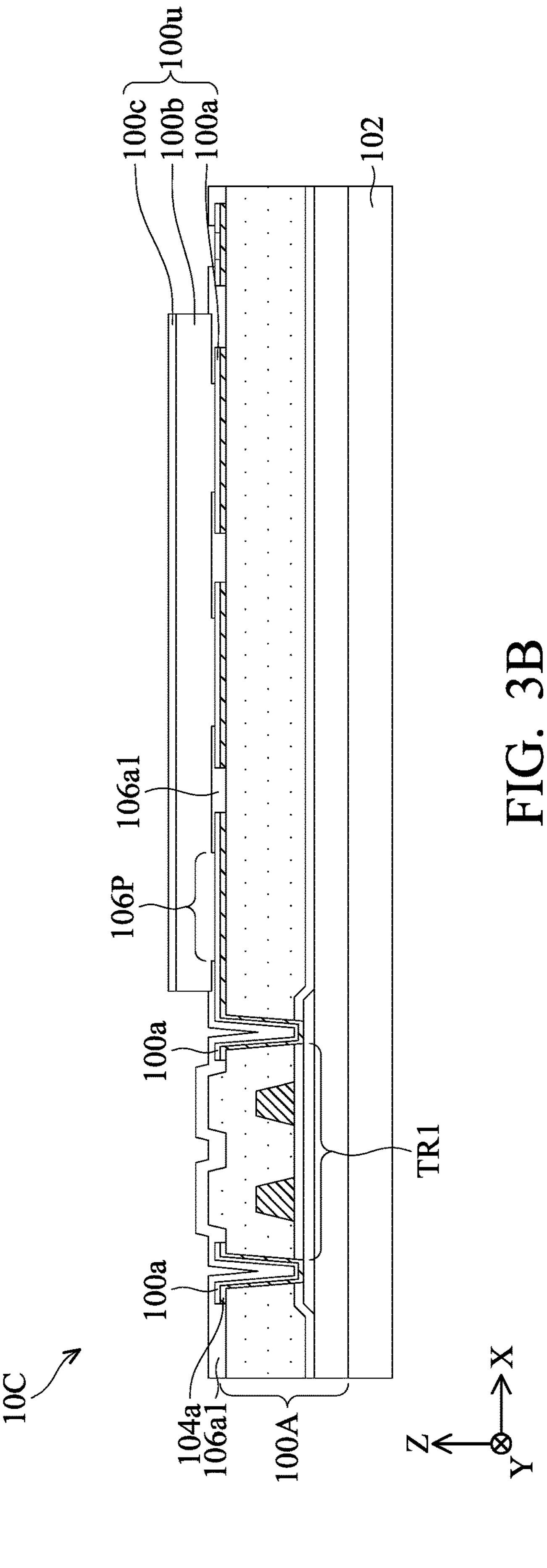
Figure 3C:
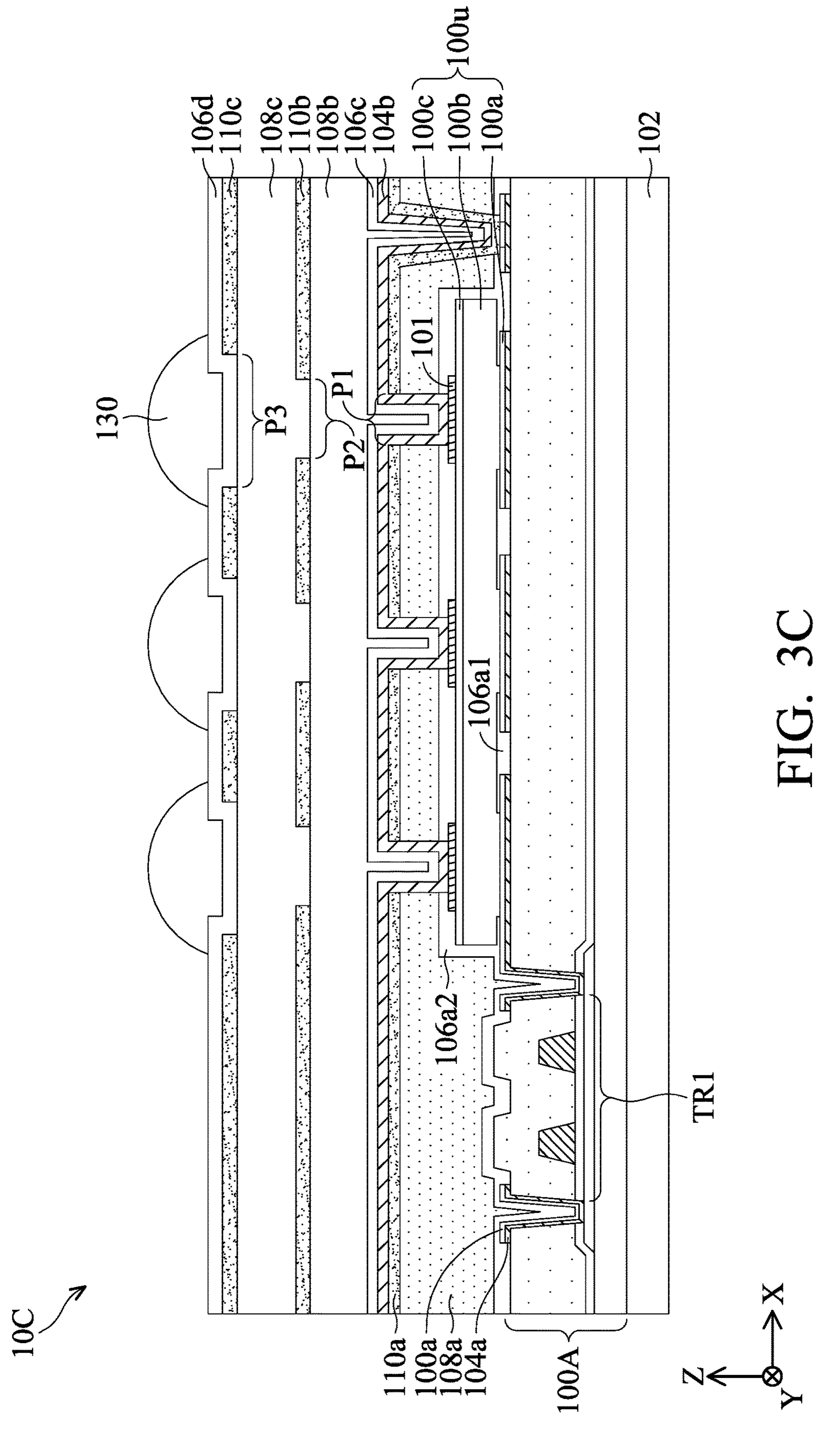

Next, please refer to FIG. 3A to FIG. 3C. FIG. 3A to FIG. 3C are cross-sectional diagrams of a sensing device 10C in different manufacturing stages in accordance with some other embodiments of the present disclosure. It should be understood that, additional operation steps may be provided before, during and/or after the method of manufacturing the sensing device 10C. In accordance with some embodiments, some of the operation steps may be replaced or omitted. In accordance with some embodiments, the order of some of the operation steps may be interchangeable. In addition, it should be understood that, for clarity, some components of the sensing device 10C are omitted in the drawing, and only some components are schematically shown. In accordance with some embodiments, additional features may be added to the sensing device 10C described below. In accordance with some other embodiments, some features of the sensing device 10C described below may be replaced or omitted.

First, referring to FIG. 3A, the substrate 102 is provided. Next, the circuit layer 100A is formed on the substrate 102. It should be understood that although only the thin-film transistor TR1 is shown in the drawing, the circuit layer 100A of the sensing device 10B may further include other thin-film transistors. The circuit layer 100A includes the conductive layer 104*a*. Specifically, in accordance with some embodiments, portions of the gate dielectric layer and the dielectric layer in the circuit layer 100A are removed by a patterning process to form the via hole V1, and then the conductive layer 104*a* is formed in the via hole V1. Next, the first-type semiconductor layer 100*a* of the photosensitive element 100*u* is formed on the conductive layer 104*a*. Specifically, the first-type semiconductor layer 100*a* is conformally formed on the conductive layer 104*a*. Furthermore, the first-type semiconductor layer 100*a* and the conductive layer 104*a*, for example, are patterned together to form a discontinuous structure.

Please refer to FIG. 3B. Next, the insulating layer 106*a*1 is formed on the first-type semiconductor layer 100*a*, and portions of the insulating layer 106*a*1 are removed by a patterning process to form a plurality of openings 106P. The openings 106P expose portions of the first-type semiconductor layer 100*a*. Next, the intrinsic semiconductor layer 100*b* and the second-type semiconductor layer 100*c* are sequentially formed on the first-type semiconductor layer 100*a*. The insulating layer 106*a*1 has a plurality of openings 106P, through which the intrinsic semiconductor layer 100*b* is in contact with the first-type semiconductor layer 100*a*. Specifically, the photosensitive element 100*u* includes the first-type semiconductor layer 100*a*, the second-type semiconductor layer 100*c*, and the intrinsic semiconductor layer 100*b* disposed between the first-type semiconductor layer 100*a* and the second-type semiconductor layer 100*c*. In addition, a portion of the insulating layer 106*a*1 is disposed between the first-type semiconductor layer 100*a* and the intrinsic semiconductor layer 100*b*.

Next, please refer to FIG. 3C. Then, the transparent conductive layer 101 is formed on the second-type semiconductor layer 100*c* of the photosensitive element 100*u*. For example, a plurality of transparent conductive layers 101 can be formed on the second-type semiconductor layer 100*c*. After that, the insulating layer 106*a*2 and the insulating layer 108*a* are formed on the photosensitive element 100*u*. The insulating layer 106*a*2 is conformally formed on the circuit layer 100A, the photosensitive element 100*u* and the transparent conductive layer 101. The insulating layer 106*a*2 covers the conductive layer 104*a* and the first-type semiconductor layer 100*a* or can be further in contact with the insulating layer **106*a*1, and then the insulating layer 108*a* is formed on the insulating layer 106*a*2**.

Next, the light-shielding layer **110*a* is formed on the insulating layer 108*a*. In addition, the opening P1 is formed in the light-shielding layer 110*a*, and the opening P1 overlaps the photosensitive element 100*u* in the normal direction of the substrate 102 (e.g., the Z direction in the drawing). Then, the insulating layer 106*a* and the insulating layer 108*a* are patterned through the opening P1 to expose the photosensitive element 100*u*. Specifically, a portion of the light-shielding layer 110*a* is removed to form the opening P1. The light-shielding layer 110*a* is then used as a mask to perform a patterning process on the insulating layer 106*a* and the insulating layer 108*a*, and the insulating layer 106*a* and the insulating layer 108*a* located below the opening P1 are removed to form a hole exposing a portion of the photosensitive element 100*u* (for example, the transparent conductive layer 101 serving as an electrode of the photosensitive element 100*u*). After that, the conductive layer 104*b* is formed on the light-shielding layer 110*a*, and the conductive layer 104*b* passes through the opening P1 and is electrically connected to the photosensitive element 100*u***.

Next, the insulating layer **106*c* is formed on the conductive layer 104*b*. The insulating layer 106*c* is conformally formed on the conductive layer 104*b*, and extends into the aforementioned hole exposing the photosensitive element 100*u*. Next, the insulating layer 108*b* is formed on the insulating layer 106*c*, and a portion of the insulating layer 108*b* also extends into the aforementioned hole exposing the photosensitive element 100*u*. After that, the light-shielding layer 110*b*, the insulating layer 108*c*, the light-shielding layer 110*c*, and the insulating layer 106*d* are sequentially formed above the insulating layer 108*b*. In addition, the insulating layer 106*d* is formed on the insulating layer 108*c* and the light-shielding layer 110*c*, and the microlens 130 is formed on the insulating layer 106*d***.

It should be noted that, in this embodiment, a plurality of transparent conductive layers 101 are in contact with the same photosensitive element **100*u* (for example, the second-type semiconductor layer 100*c*). Therefore, the photosensitive element 100*u*** has fewer edges, which can reduce the occurrence of problems such as structural defects or leakage currents at the edge.

Figure 4B:
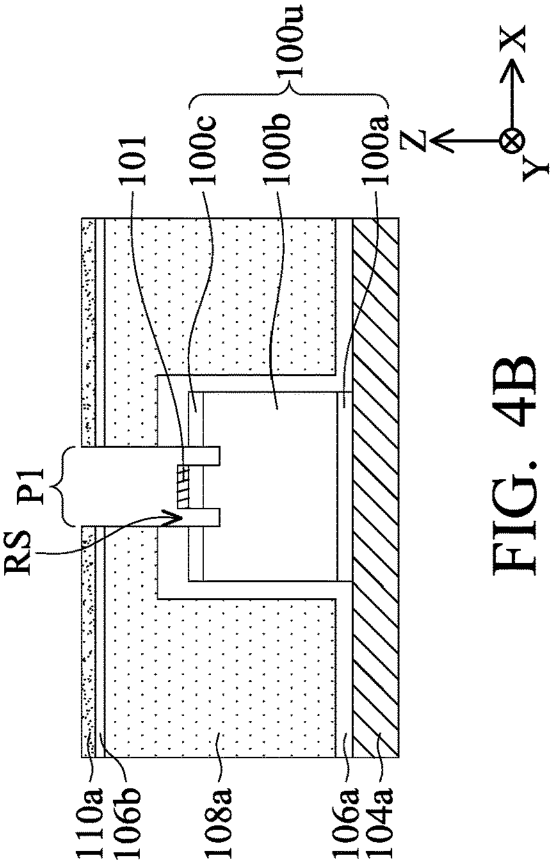
FIG. 4A to FIG. 4C are cross-sectional diagrams of some elements of a sensing device in different manufacturing stages in accordance with some embodiments of the present disclosure.
Figure 4A:
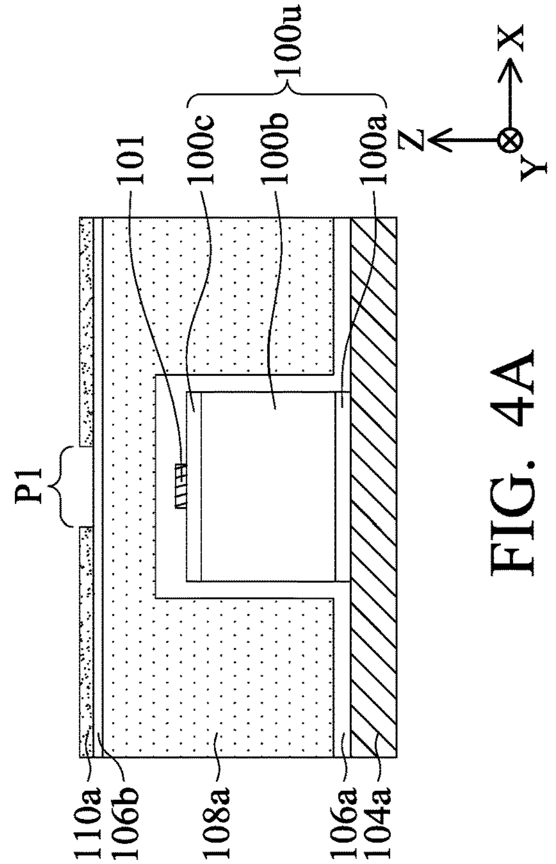
Figure 4C:
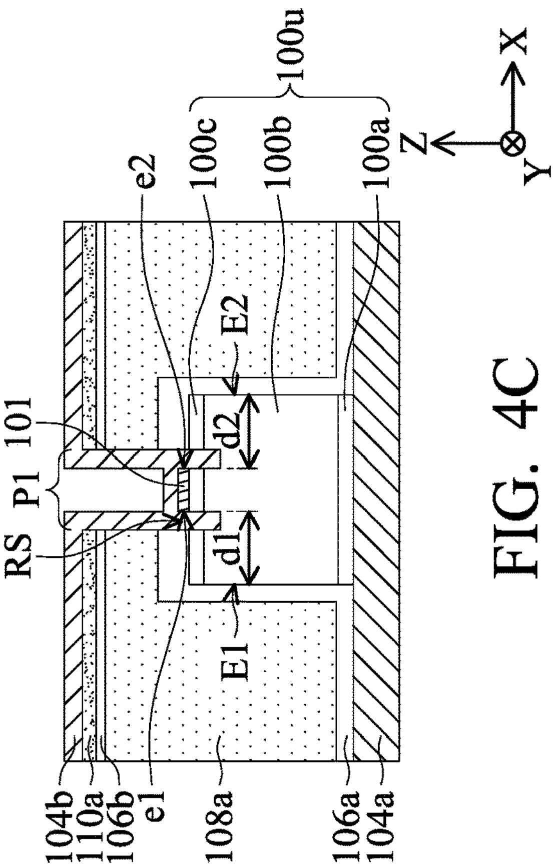

Next, please refer to FIG. 4A to FIG. 4C, which are cross-sectional diagrams of some elements of a sensing device in different manufacturing stages in accordance with some embodiments of the present disclosure. Specifically, FIG. 4A to FIG. 4C show partial cross-sectional diagrams of the sensing device to illustrate the detailed structure of the photosensitive element **100*u***.

As shown in FIG. 4A, after the first-type semiconductor layer **100*a*, the intrinsic semiconductor layer 100*b* and the second-type semiconductor layer 100*c* are sequentially formed on the conductive layer 104*a*, the transparent conductive layer 101 is formed on the second-type semiconductor layer 100*c*. Moreover, the transparent conductive layer 101 is patterned by one or more photolithography process and/or etching process, so that the edge of the transparent conductive layer 101 is indented compared to the edge of the photosensitive element 100*u* (e.g., the edge of the second-type semiconductor layer 100*c* edge). As described above, next, the insulating layer 106*a*, the insulating layer 108*a*, the insulating layer 106*b* and the light-shielding layer 110*a* are formed on the photosensitive element 100*u* and the transparent conductive layer 101**.

As shown in FIG. 4B, the insulating layer **106*b*, the insulating layer 108, and the insulating layer 106*a* are patterned through the opening P1 of the light-shielding layer 110*a*. When the insulating layer 106*a* is patterned in this embodiment, portions of the photosensitive element 100*u* (for example, the second-type semiconductor layer 100*c* and the intrinsic semiconductor layer 100*b*) can be further removed. Specifically, the width of the transparent conductive layer 101 is smaller than the width of the opening P1, the transparent conductive layer 101 can be used as a mask to remove portions of the second-type semiconductor layer 100*c* and the intrinsic semiconductor layer 100*b* to form a recess RS in the photosensitive element 100*u*. The recess RS at least partially surrounds the transparent conductive layer 101. The recess RS extends downward from the transparent conductive layer 101 to the intrinsic semiconductor layer 100*b***.

Please refer to FIG. 4C. Then, the conductive layer **104*b* is formed on the light-shielding layer 110*a*, and the conductive layer 104*b* passes through the opening P1 to be electrically connected to the photosensitive element 100*u*. The conductive layer 104*b* is formed on the transparent conductive layer 101 and is electrically connected to the transparent conductive layer 101, and a portion of the conductive layer 104*b* is formed in the recess RS. Specifically, the conductive layer 104*b* is conformally formed on the light-shielding layer 110*a*, and extends into the hole exposing the photosensitive element 100*u* and the recess RS. The conductive layer 104*b* is formed on the side surfaces of the insulating layer 106*a*, the insulating layer 108*a*, the insulating layer 106*b* and the light-shielding layer 110*a*, and the conductive layer 104*b* can partially extend into the second-type semiconductor layer 100*c* and the intrinsic semiconductor layer 100*b* of the photosensitive element 100*u***.

As shown in FIG. 4C, in accordance with some embodiments, in a cross-section of the sensing device, an edge included in the transparent conductive layer 101 and an edge included in the photosensitive element are adjacent to each other and separated by a distance. For example, a first edge e1 of the transparent conductive layer 101 and a first edge E1 of the photosensitive element **100*u* (e.g., an edge of the second-type semiconductor layer 100*c*) are separated from each other by a first distance d1, and a second edge e2 of the transparent conductive layer 101 and a second edge E2 of the photosensitive element 100*u* (e.g., the other edge of the second-type semiconductor layer 100*c*) are separated from each other by a second distance d2. The first edge e1 of the transparent conductive layer 101 is opposite to the second edge e2, and the first edge E1 of the photosensitive element 100*u* is opposite to the second edge E2. In this embodiment, the second distance d2 is different from the first distance d1**, but it is not limited thereto.

Figure 5B:
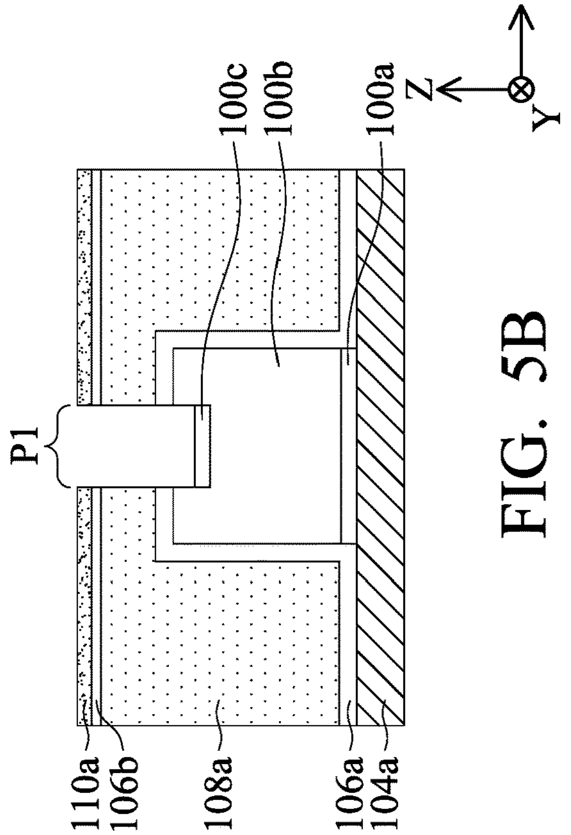
FIG. 5A to FIG. 5C are cross-sectional diagrams of some elements of a sensing device in different manufacturing stages in accordance with some embodiments of the present disclosure.
Figure 5A:
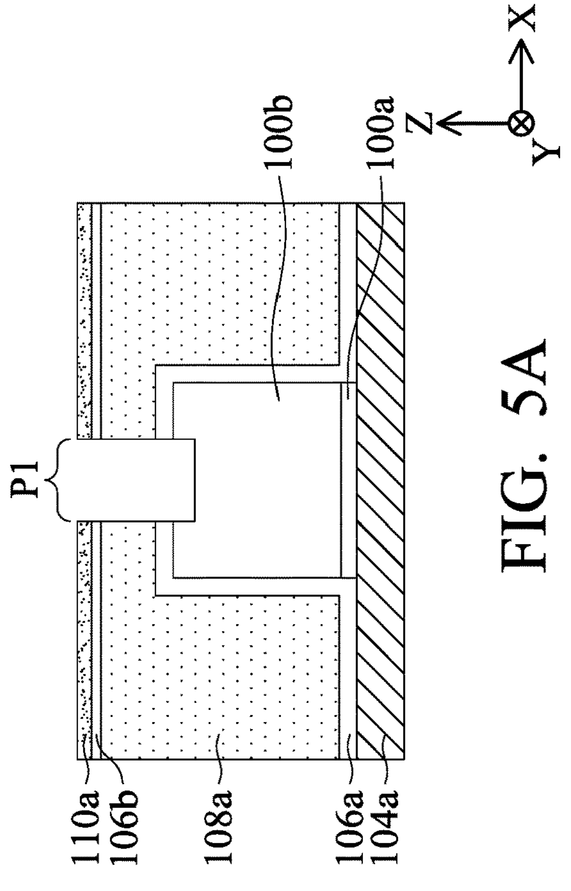
Figure 5C:
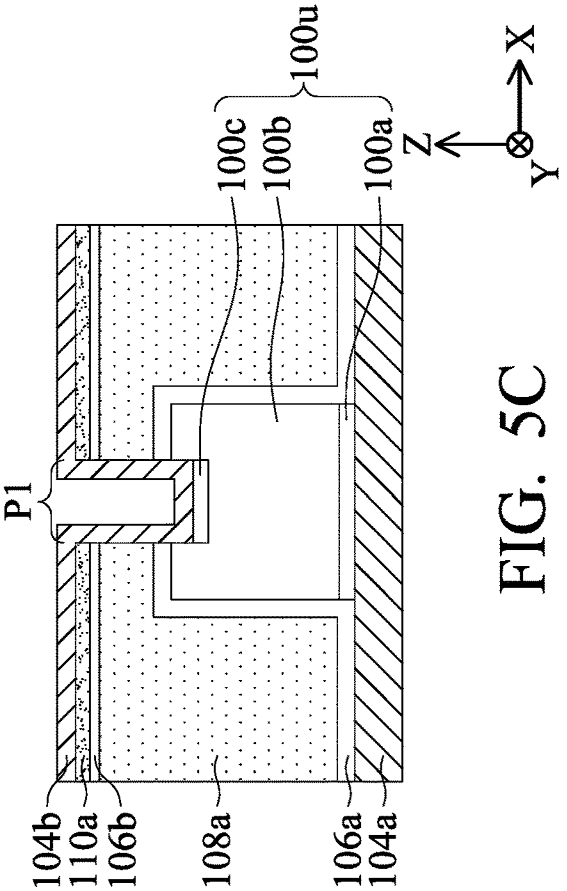

Next, please refer to FIG. 5A to FIG. 5C. FIG. 5A to FIG. 5C are cross-sectional diagrams of some elements of a sensing device in different manufacturing stages in accordance with some embodiments of the present disclosure. Specifically, FIG. 5A to FIG. 5C show partial cross-sectional diagrams of the sensing device to illustrate the detailed structure of the photosensitive element **100*u***.

As shown in FIG. 5A, in accordance with some embodiments, after the first-type semiconductor layer **100*a* and the intrinsic semiconductor layer 100*b* of the photosensitive element 100*u* are formed on the conductive layer 104*a*, the insulating layer 106*a*, the insulating layer 108*a*, the insulating layer 106*b* and the light-shielding layer 110*a* are first formed on the first-type semiconductor layer 100*a* and the intrinsic semiconductor layer 100*b* of the photosensitive element 100*u*. Then, portions of the photosensitive element 100*u*, the insulating layer 106*a*, the insulating layer 108*a*** and the insulating layer 106_b_ are patterned through the opening P1 of the light-shielding layer 110_a_ to expose the photosensitive element 100_u_. Specifically, portions of the insulating layer 106_a_, the insulating layer 108_a_ and the insulating layer 106_b_ are removed by a patterning process to expose a portion of the intrinsic semiconductor layer 100_b_.

Referring to FIG. 5B, then, a portion of the exposed intrinsic semiconductor layer 100_b_ is doped to form the second-type semiconductor layer 100_c_. In this embodiment, the light-shielding layer 110_a_ is patterned first to form the opening P1, and then an ion-implantation process is performed on the intrinsic semiconductor layer 100_b_ through the opening P1 to form the second-type semiconductor layer 100_c_. Since the second-type semiconductor layer 100_c_ is formed after the opening P1, in this embodiment, the range of the second-type semiconductor layer 100_c_ substantially corresponds to the opening P1, and the width of the second-type semiconductor layer 100_c_ is smaller than the width of the intrinsic semiconductor layer 100_b_.

Please refer to FIG. 5C, then, the conductive layer 104_b_ is formed on the light-shielding layer 110_a_, and the conductive layer 104_b_ passes through the opening P1 to be electrically connected to the photosensitive element 100_u_, and the conductive layer 104_b_ is in contact with the second-type semiconductor layer 100_c_. In this embodiment, the conductive layer 104_b_ is further in contact with the intrinsic semiconductor layer 100_b_, but it is not limited thereto. In addition, in this embodiment, there is no need to form the transparent conductive layer 101 on the photosensitive element 100_u_.

To summarize the above, in accordance with the embodiments of the present disclosure, the method of manufacturing the sensing device can integrate parts of the structures of the elements in the sensing device. For example, partial structures of the photosensitive element and the optical element are integrated, or partial structures of the photosensitive element and the circuit layer are integrated. In this way, the number of masks and steps used in the process can be reduced, thereby reducing the complexity of the manufacturing process or improving the yield. In accordance with the embodiments of the present disclosure, the sensing device manufactured by the aforementioned manufacturing method can reduce the equivalent capacitance of the photosensitive element, thereby improving the sensitivity of the sensing device, or improving the overall performance of the sensing device. In addition, in accordance with some embodiments, the structural design of the photosensitive element can further reduce the occurrence of leakage current or reduce the capacitance value, thereby improving the performance of the photosensitive element.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Thus, the appended claims are intended to include within their scope such processes, machines, manufacture, compositions of matter, means, methods or steps. Moreover, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A sensing device, comprising:

a substrate;

a circuit layer disposed on the substrate;

a photosensitive element disposed on the substrate and electrically connected to the circuit layer;

a light-shielding layer disposed on the photosensitive element and having an opening overlapping the photosensitive element;

a conductive layer disposed on the light-shielding layer, wherein the conductive layer passes through the opening and is electrically connected to the photosensitive element; and an insulating layer disposed on the circuit layer, wherein the photosensitive element comprises a first-type semiconductor layer, a second-type semiconductor layer and an intrinsic semiconductor layer disposed between the first-type semiconductor layer and the second-type semiconductor layer, and a portion of the insulating layer is disposed between the first-type semiconductor layer and the intrinsic semiconductor layer, wherein the insulating layer has a plurality of openings, and the intrinsic semiconductor layer is in contact with the first-type semiconductor layer through the plurality of openings.

2. The sensing device as claimed in claim 1, wherein the light-shielding layer comprises a metal material, and the light-shielding layer is electrically connected to the conductive layer.

3. The sensing device as claimed in claim 1, wherein the light-shielding layer comprises an organic material, and the light-shielding layer is in contact with the conductive layer.

4. The sensing device as claimed in claim 1, wherein the circuit layer comprises a thin-film transistor, and the photosensitive element overlaps a source electrode or a drain electrode of the thin-film transistor.

5. The sensing device as claimed in claim 4, wherein the photosensitive element is in contact with the source electrode or the drain electrode of the thin-film transistor.

6. The sensing device as claimed in claim 1, further comprising a transparent conductive layer disposed between the photosensitive element and the conductive layer.

7. The sensing device as claimed in claim 6, wherein in a cross-section of the sensing device, a first edge of the transparent conductive layer and a first edge of the photosensitive element are adjacent to each other and separated by a first distance.

8. The sensing device as claimed in claim 7, wherein the first edge of the transparent conductive layer is indented compared to the first edge of the photosensitive element.

9. The sensing device as claimed in claim 7, wherein a second edge of the transparent conductive layer and a second edge of the photosensitive element are adjacent to each other and separated by a second distance, and the second distance is different from the first distance.

10. The sensing device as claimed in claim 6, wherein the photosensitive element has a recess, and the recess at least partially surrounds the transparent conductive layer.

11. The sensing device as claimed in claim 10, wherein the recess extends downward from the transparent conductive layer to the intrinsic semiconductor layer.

12. The sensing device as claimed in claim 10, wherein the conductive layer is disposed on the transparent conductive layer and is electrically connected to the transparent conductive layer, and a portion of the conductive layer is disposed in the recess.

13. A method of manufacturing the sensing device as set forth in claim 1, comprising:

providing a substrate;

forming a circuit layer on the substrate;

forming a photosensitive element on the circuit layer;

forming a first insulating layer on the photosensitive element;

forming a light-shielding layer on the first insulating layer;

forming an opening in the light-shielding layer, wherein the opening overlaps the photosensitive element;

patterning the first insulating layer through the opening to expose the photosensitive element; and forming a conductive layer on the light-shielding layer, wherein the conductive layer passes through the opening and is electrically connected to the photosensitive element, wherein the step of forming the photosensitive element on the circuit layer comprises:

forming a first-type semiconductor layer on the circuit layer;

forming a second insulating layer on the first-type semiconductor layer;

removing portions of the second insulating layer to form a plurality of openings;

forming an intrinsic semiconductor layer on the second insulating layer and the first-type semiconductor layer, wherein the intrinsic semiconductor layer is in contact with the first-type semiconductor layer through the plurality of openings; and forming a second-type semiconductor layer on the intrinsic semiconductor layer.

14. The method of manufacturing a sensing device as claimed in claim 13, further comprising:

forming a transparent conductive layer on the second-type semiconductor layer; and removing a portion of the second-type semiconductor layer and a portion of the intrinsic semiconductor layer to form a recess in the photosensitive element.

15. The method of manufacturing a sensing device as claimed in claim 14, wherein the conductive layer is formed on the transparent conductive layer and a portion of the conductive layer is formed in the recess.

16. The method of manufacturing a sensing device as claimed in claim 13, after forming the intrinsic semiconductor layer on the first-type semiconductor layer, further comprising:

removing a portion of the first insulating layer to expose a portion of the intrinsic semiconducting layer; and doping a portion of the intrinsic semiconductor layer to form the second-type semiconductor layer.

* * * * *